(12) United States Patent  
Leussler et al.

(10) Patent No.: US 10,451,692 B2  
(45) Date of Patent: Oct. 22, 2019

(54) MULTI-RESONANT T/R ANTENNA FOR MR IMAGE GENERATION

(71) Applicant: KONINKLIJKE PHILIPS N.V., Eindhoven (NL)

(72) Inventors: Christoph Leussler, Hamburg (DE); Peter Mazurkewitz, Hamburg (DE); Jochen Keupp, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 1220 days.

(21) Appl. No.: 14/372,283

(22) PCT Filed: Jan. 3, 2013

(86) PCT No.: PCT/IB2013/050041  
§ 371 (c)(1),  
(2) Date: Jul. 15, 2014

(87) PCT Pub. No.: WO2013/108142  
PCT Pub. Date: Jul. 25, 2013

(65) Prior Publication Data  
US 2015/0002156 A1   Jan. 1, 2015

Related U.S. Application Data

(60) Provisional application No. 61/587,375, filed on Jan. 17, 2012.

(30) Foreign Application Priority Data

Jan. 17, 2012 (EP) .................................... 12151337

(51) Int. Cl.  
*G01R 33/34* (2006.01)  
*G01R 33/36* (2006.01)  
*G01R 33/44* (2006.01)

(52) U.S. Cl.  
CPC ......... *G01R 33/3635* (2013.01); *G01R 33/34* (2013.01); *G01R 33/34092* (2013.01);  
(Continued)

(58) Field of Classification Search  
USPC .......................... 324/300–307; 600/407–435; 382/128–131  
See application file for complete search history.

(56) References Cited

U.S. PATENT DOCUMENTS 4,638,253 A * 1/1987 Jaskolski ......... G01R 33/34046  
324/311  
5,168,230 A 12/1992 Hashoian  
(Continued)

FOREIGN PATENT DOCUMENTS

JP  5000108  8/1993  
WO  2010018535 A1  2/2010

OTHER PUBLICATIONS

Matson, G.B. et al "A Practical Double-Tuned 1H/31P Quadrature Birdcage Headcoil Optimized for 31P Operation", Magnetic Resonance in Medicine, vol. 42, No. 1, Jul. 1999, pp. 173-182.  
(Continued)

*Primary Examiner* — Melissa J Koval  
*Assistant Examiner* — Tiffany Fetzner

(57) ABSTRACT

A dual- or multi-resonant RF/MR transmit and/or receive antenna (1, 2) especially in the form of a planar antenna or a volume array antenna (also called antenna array) is used for MR image generation of at least two different nuclei like e.g. $^1H$, $^{19}F$, $^3He$, $^{13}C$, $^{23}Na$ or other nuclei having different Larmor frequencies. The antenna is coupled by an inductive coupling device (LI) with related transmit/receive channels (T/R). By such an inductive coupling, the tuning and matching of the antenna at the different resonant frequencies is easier than in case of a galvanic connection. The dual- or  
(Continued)

multi-resonant RF/MR transmit and/or receive antenna is used in an MR imaging apparatus.

17 Claims, 10 Drawing Sheets

(52) U.S. Cl.
CPC ....... G01R 33/3642 (2013.01); G01R 33/446 (2013.01); *G01R 33/3628* (2013.01)

(56) References Cited

U.S. PATENT DOCUMENTS

| | | | | |
|---|---|---|---|---|
| 5,243,289 | A * | 9/1993 | Blum | G01R 33/3635 324/322 |
| 5,276,398 | A * | 1/1994 | Withers | G01R 33/34 324/318 |
| 5,424,645 | A * | 6/1995 | Doty | G01R 33/3635 324/318 |
| 5,675,254 | A | 10/1997 | Fiat | |
| 6,054,858 | A * | 4/2000 | Dumoulin | G01R 33/3628 324/314 |
| 6,184,684 | B1 * | 2/2001 | Dumoulin | G01R 33/3628 324/318 |
| 6,496,708 | B1 | 12/2002 | Chan et al. | |
| 7,508,212 | B2 | 3/2009 | Fain | |
| 7,800,368 | B2 * | 9/2010 | Vaughan | G01R 33/583 324/318 |
| 8,193,811 | B2 * | 6/2012 | Tropp | G01R 33/3415 324/318 |
| 9,500,727 | B2 * | 11/2016 | Sohn | G01R 33/34092 |
| 2001/0033165 | A1 | 10/2001 | Tomanek | |
| 2002/0026224 | A1 * | 2/2002 | Thompson | A61N 1/025 607/60 |
| 2003/0020553 | A1 * | 1/2003 | Gao | H01P 1/20381 331/66 |
| 2008/0129298 | A1 * | 6/2008 | Vaughan | G01R 33/5612 324/322 |
| 2009/0160442 | A1 | 6/2009 | Mazurkewitz | |
| 2010/0301862 | A1 | 12/2010 | Tropp et al. | |
| 2015/0002156 | A1 * | 1/2015 | Leussler | G01R 33/3635 324/322 |

OTHER PUBLICATIONS

Tropp, J. et al "A Dual-Tuned Probe and Multiband Receiver Front End for X-Nucleous Spectroscopy with Proton Scout Imaging in Vivo", Magnetic Resonance in Medicine, vol. 11, No. 3, Sep. 2989, pp. 405-412.
Alecci et al "IH and 23NA MIR of Rat Head at 4 Tesla With Simple Double Tuned RF Surface Oil" Proc. Intl. Soc. Mag. Reson. Med 14 (2006) p. 3105.
Morawski et al "Quantitative " Magnetic Resonance Immunohistochemistry "With Ligand-Targeted F Nanoparticles" Magnetic Resonance in MED. 52: R 1255-1562 (2004).
Gonen et al "Simultaneous 3D NMR Spectroscopy of Proton Decoupled Fluorine and Phosphorus in Human Liver During 5-Fluorouracil Chemotherapy" MRM 37:164 (1997).
Krems B et al., "F-(1H) Nuclear Overhauser Effect and Proton Decoupling of 5-Fluorouracil..." Journal of Magnetic Resonance, Series B vol. 108:p. 155-164 (1995).

* cited by examiner (A)  (B)

MULTI-RESONANT T/R ANTENNA FOR MR IMAGE GENERATION

CROSS-REFERENCE TO PRIOR APPLICATIONS

This application is the U.S. National Phase application under 35 U.S.C. § 371 of International Application No. PCT/IB2013/050041, filed on Jan. 3, 2013, which claims the benefit of U.S. Provisional Patent Application No. 61/587,375, filed on Jan. 17, 2012 and European Patent Application No. 12151337.8, filed on Jan. 17 2012. These applications are hereby incorporated by reference herein.

FIELD OF THE INVENTION

The invention relates to a dual- or multi-resonant RF/MR transmit and/or receive antenna especially in the form of a planar antenna or a volume array antenna (also called antenna array), for MR image generation of at least two different nuclei like e.g. $^1H$, $^{19}F$, $^3He$, $^{13}C$, $^{23}Na$ or other nuclei having different Larmor frequencies. Further, the invention relates to an MR imaging apparatus comprising such a dual- or multi-resonant RF/MR transmit and/or receive antenna.

BACKGROUND OF THE INVENTION

In an MRI apparatus (or an MR scanner), an examination object, usually a patient, is exposed within the examination space of the MRI apparatus to a uniform main magnetic field ($B_0$ field) so that the magnetic moments of the nuclei within the examination object tend to rotate around the axis of the applied $B_0$ field (Larmor precession) with a certain net magnetization of all nuclei parallel to the $B_0$ field. The rate of precession is called Larmor frequency which is dependent on the specific physical characteristics of the involved nuclei and the strength of the applied $B_0$ field.

By transmitting an RF excitation pulse ($B_1$ field) which is orthogonal to the $B_0$ field, generated by means of an RF transmit antenna or coil, and matching the Larmor frequency of the nuclei of interest, the spins of the nuclei are excited and brought into phase, and a deflection of their net magnetization from the direction of the $B_0$ field is obtained, so that a transversal component in relation to the longitudinal component of the net magnetization is generated.

After termination of the RF excitation pulse, the MR relaxation processes of the longitudinal and transversal components of the net magnetization begin, until the net magnetization has returned to its equilibrium state. MR relaxation signals which are emitted by the relaxation processes, are detected by means of an RF/MR receive antenna or coil. The received MR signals which are time-based amplitude signals, are Fourier transformed to frequency-based MR spectrum signals and processed for generating an MR image of the nuclei of interest within an examination object. In order to obtain a spatial selection of a slice or volume of interest within the examination object and a spatial encoding of the received MR relaxation signals emanating from a slice or volume of interest, gradient magnetic fields are superimposed on the $B_0$ field, having the same direction as the $B_0$ field, but having gradients in the orthogonal x-, y- and z-directions. Due to the fact that the Larmor frequency is dependent on the strength of the magnetic field which is imposed on the nuclei, the Larmor frequency of the nuclei accordingly decreases along and with the decreasing gradient (and vice versa) of the total, superimposed $B_0$ field, so that by appropriately tuning the frequency of the transmitted RF excitation pulse (and by accordingly tuning the resonance frequency of the RF/MR receive antenna), and by accordingly controlling the gradient magnetic fields, a selection of nuclei within a slice at a certain location along each gradient in the x-, y- and z-direction, and by this, in total, within a certain voxel of the object can be obtained.

The above RF/MR (transmit and/or receive) antennas can be provided both in the form of so-called body coils (also called whole body coils) which are fixedly mounted within an examination space of an MRI system for imaging a whole examination object, and as so-called surface or local coils which are arranged directly on or around a local zone or area to be examined and which are constructed e.g. in the form of flexible pads or sleeves or cages like head coils. Both the above types can be realized in the form of a volume resonator (like a birdcage coil or a TEM resonator) or in the form of a (planar or volume) array antenna (or array coil) which comprises a set of coil elements which are decoupled from one another and which each transmit/receive their own localized magnetic field.

For MR imaging an examination object like a patient, the nuclei of interest in human tissue are usually $^1H$ protons, so that the above RF transmit/receive antennas are accordingly tuned to the Larmor frequency of $^1H$ protons. However, for imaging certain organs by means of contrast agents, for detecting and quantifying labeled tracers and drugs in the field of molecular imaging, for examining metabolism or for MR spectroscopy, other nuclei are of interest to be imaged like especially $^{19}F$, $^3He$, $^{13}C$, $^{23}Na$ and other, wherein all these nuclei have substantial different Larmor frequencies. Consequently, for MR image generation, the above RF/MR transmit/receive antennas have to be tuned to two or more different Larmor frequencies in order to image both the structure of the examination object and the desired other nuclei in a common overlay of one another.

U.S. Pat. No. 7,508,212 discloses an RF resonator having a cylindrical shield formed around a central axis and a plurality of pairs of opposing conductive coil legs arranged symmetrically around the central axis, wherein the pairs of opposing conductive legs being divided into a first set and a second set, wherein the first set is tuned to a first Larmor frequency and the second set is tuned to a second Larmor frequency. Further, a first drive circuitry is connected to each pair of opposing legs in the first set and a second drive circuitry is connected to each pair of opposing legs in the second set, wherein each drive circuitry comprises current baluns for electrically isolating the drive circuitry from the coil legs, and tune and match circuits for conducting multi-nuclear measurements simultaneously at different Larmor frequencies.

U.S. Pat. No. 5,168,230 discloses a dual frequency NMR coil pair which is comprised of two individual coils tuned to separate resonant frequencies. Each coil is formed into approximately the same shape by a conductive loop which follows a serpentine path to define an inner area and a plurality of outer lobes. The two individual coils are positioned in close proximity overlying each other, but rotated with respect to each other such that the outer lobes of the two respective coils are interleaved. By this, a mutual loading between the two individual coils shall essentially be eliminated, permitting a dual frequency operation with minimal degradation of signal to noise ratio in either coil, while both coils substantially have the same field of view.

US 2009/0160442 discloses an MR transmit/receive coil which can resonate at least at two different (Larmor) frequencies. It comprises a tuning resonant circuit which is serially coupled into the coil and which comprises tuning components, the values of which are selected such that a sensitivity profile of the coil resonating at the first resonant frequency substantially matches the sensitivity profile of the coil resonating at the second resonant frequency.

The international application WO2010/018535 mentions that an RF TEM coil built from strip lines can be made multi-resonant. Further, the TEM strip lines are connected via impedance networks to a transmitter or receiver.

SUMMARY OF THE INVENTION

One problem of the above and other dual or multi resonant RF antennas is that the tuning and matching of the antennas to the transmit and/or receive units or channels, which are provided for feeding the antennas with RF transmit (excitation) signals at the different frequencies and/or for processing the received MR relaxation signals at the different frequencies, is a complex procedure.

This is true because such dual- or multi-resonant antennas require many degrees of freedom to be controlled for optimal tuning and matching, especially on the non-proton channels because of the usually lower sensitivity and lower concentration of the non-proton nuclei (e.g. $^{19}F$) in comparison to the proton nuclei ($^1H$) within an examination object.

Further, especially in case of surface coils which are positioned close to an examination object, the large possible variability in coil positioning leads to large range changes of coil loading to be addressed with the said tuning and matching.

Generally, the complexity for tuning non-proton coil arrays may compromise the applicability of such coil arrays substantially.

An object underlying the invention is to avoid the tuning and matching problems and to provide a dual- or multi-resonant RF/MR transmit and/or receive antenna or coil for MR image generation of at least two different nuclei (i.e. nuclei having different Larmor frequencies), which does not require a complex tuning and matching procedure, especially for the (clinical) end user.

This object is solved by a dual- or multi-resonant RF/MR transmit and/or receive antenna and an inductive coupling device according to claim 1 or claim 4.

This solution has the advantage, that tuning and matching of the dual or multi-resonant antenna to the related to transmit and/or receive units (i.e. transmit/receive channel) is much easier and can be conducted independently from each other. This applies for both (all) resonant frequencies because the inductive coupling is broadband. According to the invention, the magnetic flux can be varied and consequently the inductive coupling of the antenna to the RF/MR transmit and or receive channel is adjustable.

The dependent claims disclose advantageous embodiments of such a dual- or multi-resonant RF/MR transmit and/or receive antenna.

It will be appreciated that features of the invention are susceptible to being combined in any combination without departing from the scope of the invention as defined by the accompanying claims.

Further details, features and advantages of the invention will become apparent from the following description of preferred and exemplary embodiments of the invention which are given with reference to the drawings.

DETAILED DESCRIPTION OF EMBODIMENTS

In all Figures, the same or corresponding components and elements are denoted with the same or corresponding reference numbers. Accordingly, substantially only the differences and variations of the embodiments are explained in comparison to the first embodiment shown in FIG. 1.

Figure 1:
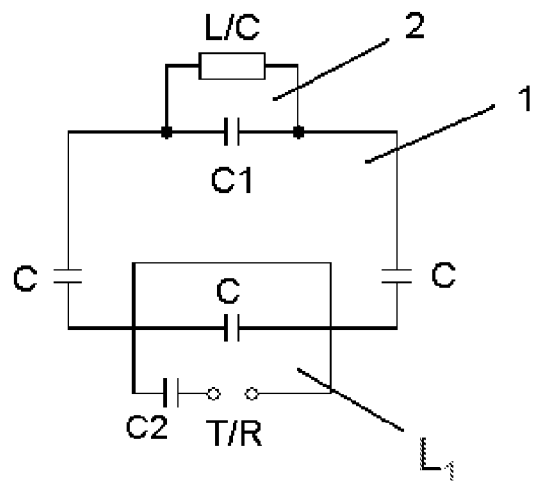
FIG. 1 schematically shows a first basic configuration of an inductive coupling device of a first embodiment of an antenna.

FIG. 1 shows a schematic circuit diagram of a first basic configuration of an inductive coupling device L1 by means of which an RF/MR transmit and/or receive antenna 1, 2 according to a first embodiment of the invention is inductively coupled to terminals T/R. Known transmit and/or receive units or other operating units or channels for operating the RF/MR transmit and/or receive antenna 1, 2 for transmitting RF excitation signals and/or for processing MR relaxation signals which are received by the antenna 1, 2 are connected with the terminals T/R.

The RF/MR transmit and/or receive antenna 1, 2 is a known dual resonant antenna as disclosed e.g. in US 2009/0160442 and comprises a coil 1 and a resonant circuit (or oscillator circuit) 2, which is serially connected into the coil 1 and which especially consists of a parallel connection of a first capacitor C1 and an impedance circuit L/C, which latter consists for example of either an inductor or a series connection of an inductor and a capacitor. The coil 1 comprises further capacitors C which are exemplarily indicated and connected serially into the coil 1 and which are selected and dimensioned as disclosed in the above US 2009/0160442 such that the antenna 1, 2 is resonant at two desired frequencies. The same accordingly applies for all other antennas 1, 2 as shown in FIGS. 2 to 15, 17 and 20 to 22.

The antenna 1, 2 is provided for example in the form of a local coil like a surface coil which is realized in a conventional manner for example by means of a conductor loop, for example a strip line on a rigid carrier material like a printed circuit board, or on a flexible carrier material in the form of for example a curved or saddle type or other local coil.

The antenna 1, 2 has a first and a second resonant frequency which are selected to correspond with two different Larmor frequencies of two different nuclei to be imaged. By this, one and the same antenna 1, 2 can be used at both Larmor frequencies at the same time (i.e. for transmitting RF excitation signals and/or for receiving MR relaxation signals). The spatial sensitivity/transmit profiles are practically the same at these two Larmor frequencies due to the substantially same electrical current patterns in the coil at both these frequencies.

In case of a multi-resonant RF/MR antenna 1, 2 which is to be operated at more than two Larmor frequencies, e.g. more than one resonant circuit 2 is serially connected into the coil 1.

According to the invention, the above dual- or multi-resonant RF/MR transmit and/or receive antenna is inductively coupled according to the invention by means of an inductive coupling device especially in the form of at least one inductive coupling loop or coil L1, instead of a galvanic connection, with related transmit/receive units as mentioned above.

By this, the tuning of the antenna 1, 2 to the at least two resonant frequencies and the matching of the antenna 1, 2 to the transmit/receive units at these frequencies at the same time can be realized in an easier manner than in case of a galvanic connection. This is especially relevant for surface coils which due to their close proximity to the examination object and the large possible variability in coil positioning are exposed to large range changes of coil loading to be addressed with tuning and matching.

Figure 2:
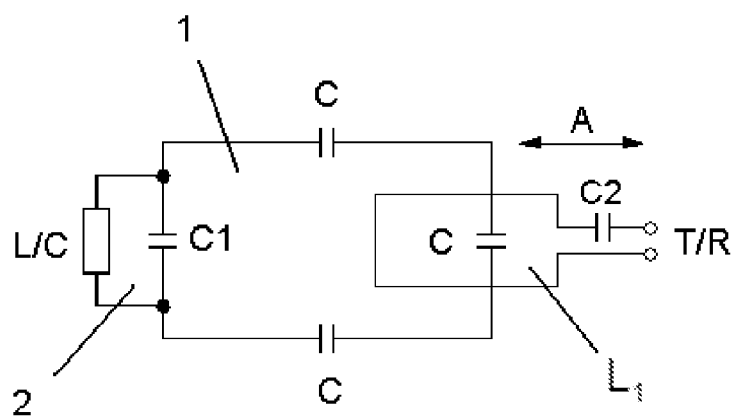
FIG. 2 schematically shows a second basic configuration of an inductive coupling device of the first embodiment of the antenna.

In comparison to FIG. 1 which schematically indicates an inductive coupling loop L1 for obtaining a fixed inductive tuning and matching, FIG. 2 schematically indicates a second basic configuration of an inductive coupling device of an antenna by means of an inductive coupling loop L1 for obtaining a variable and by this adjustable inductive tuning and matching.

In order to obtain such a variable tuning and matching, the inductive coupling loop L1 is arranged such that it can be mechanically displaced in the plane of the coil 1 as indicated by the arrow A, so that the overlapping area between the antenna 1, 2 and the coupling loop L1 and by this the magnetic flux and consequently the coupling between both accordingly increases or decreases and by this the tuning and matching can be adjusted appropriately.

Finally, as indicated in FIGS. 1 and 2, preferably a second capacitor C2 is serially connected into the inductive coupling loop L1. In dependence on the capacitance of this second capacitor C2 the inductance of the inductive coupling loop L1 can effectively at least partly be compensated in order to accordingly adjust the current flowing in the inductive coupling loop L1.

Generally, the inductive coupling loop L1 according to FIGS. 1 and 2 can be realized by one or a plurality of windings of a conductor. The number of windings is selected especially in dependence on the effective area which is available for the coupling loop and/or on the desired coupling factor. Usually, especially for lower frequencies, more windings will be necessary then for higher frequencies.

If a desired coupling factor cannot be obtained by one such coupling loop L1 for both frequencies, also two coupling loops, each one for one of the two frequencies, can be provided. Again, the individual coupling loops can have one or a plurality of windings, wherein the number of windings of both loops can be the same or different. The individual loops can be positioned side by side or partly or totally above each other as will be explained below.

By the above dimensioning of the at least one inductive coupling loop L1, the matching of the impedance of the antenna 1, 2 to the impedance of the related transmit/receive channel, and the tuning of the antenna 1, 2 can be realized for both resonant frequencies of the antenna and for transmitting and receiving independent from each other. Further, by the inductive coupling, the symmetry of the antenna 1, 2 is not substantially influenced, and the current distribution and homogeneity remains at least substantially unchanged. Finally, such an inductive coupling is much more frequency broad-band than a galvanic connection of the antenna. The principles and dimensioning of inductive couplings and inductive matching for probeheads per se can be found in Mispelter et al. "NMR probeheads for biophysical and biomedical experiments" (Chapter 3.3 pages 56-73.).

Figure 3:
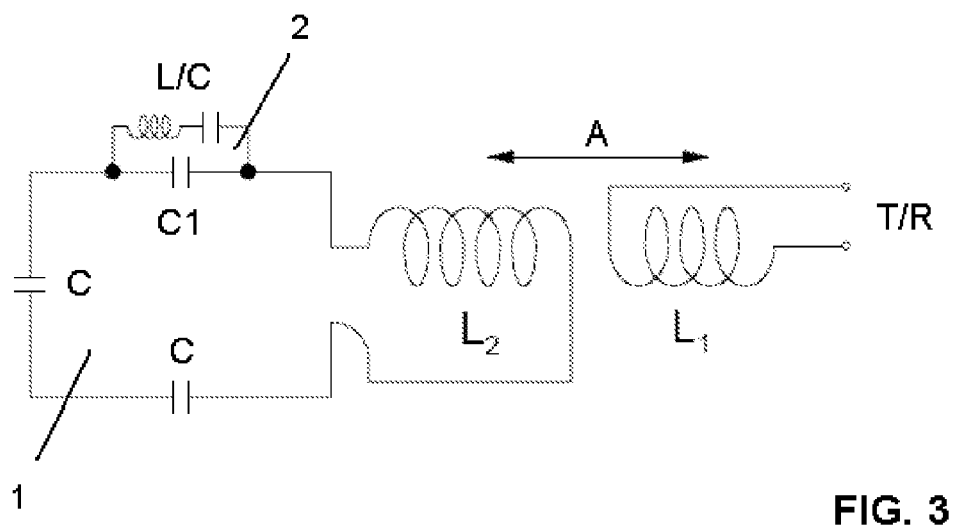
FIG. 3 shows a first embodiment of an inductive coupling device.

FIG. 3 shows a dual resonant antenna 1, 2 according to the first embodiment indicated in FIGS. 1 and 2 which is inductively coupled by means of a first embodiment of an inductive coupling device L1, L2 with terminals T/R with which a transmit and/or receive channel is connected for feeding the antenna with RF excitation signals to be transmitted and/or for processing MR relaxation signals which are received by the antenna as mentioned above.

The first embodiment of the inductive coupling device is realized in the form of a first coil L1 which is connected with the terminals T/R and which comprises a first number of windings, and a second coil L2 which is connected with the antenna 1, 2 and which has a second number of windings. Both coils L1, L2 are arranged such that they can be mechanically shifted or displaced in relation to each other along a common longitudinal axis of the coils as indicated by the arrow A in order to adjust the magnetic flux and consequently the inductive coupling between both and by this the tuning and matching of the antenna 1, 2 as explained above.

Figure 4:
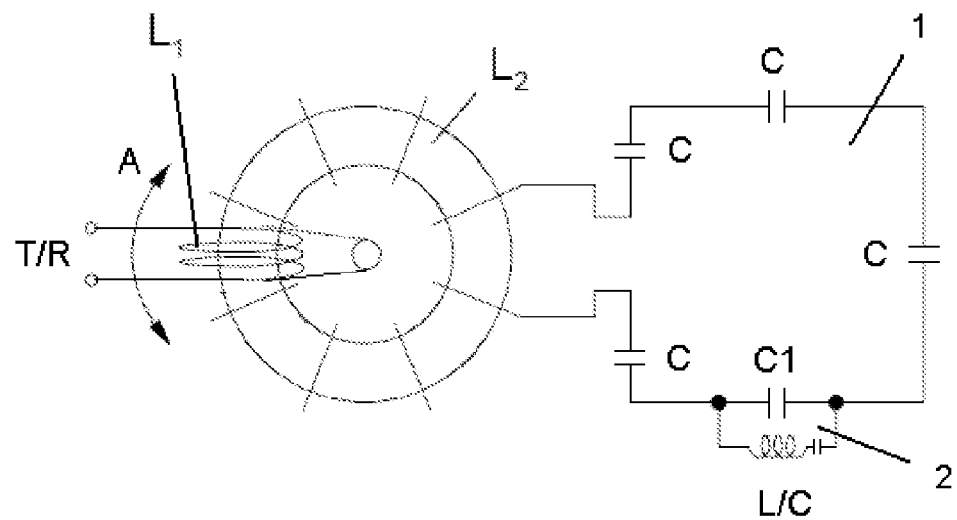
FIG. 4 shows a second embodiment of an inductive coupling device.

FIG. 4 shows a dual resonant antenna 1, 2, again according to the first embodiment which is inductively coupled by means of a second embodiment of an inductive coupling device L1, L2 with terminals T/R for connecting a transmit and/or receive channel as mentioned above.

The second embodiment of the inductive coupling device comprises a first coil L1 which is connected with the terminals T/R and which comprises a first number of windings, and a second coil L2 in the form of a toroid coil which is connected with the antenna 1, 2. The first coil L1 is wound around a section of the toroid coil L2 and arranged such that it can be rotated along at least a part of the toroid coil L2 as indicated by the arrow A. By this, the magnetic flux and consequently the inductive coupling between both coils L1, L2 and by this the tuning and matching of the antenna 1, 2 can be adjusted as explained above.

Figure 5:
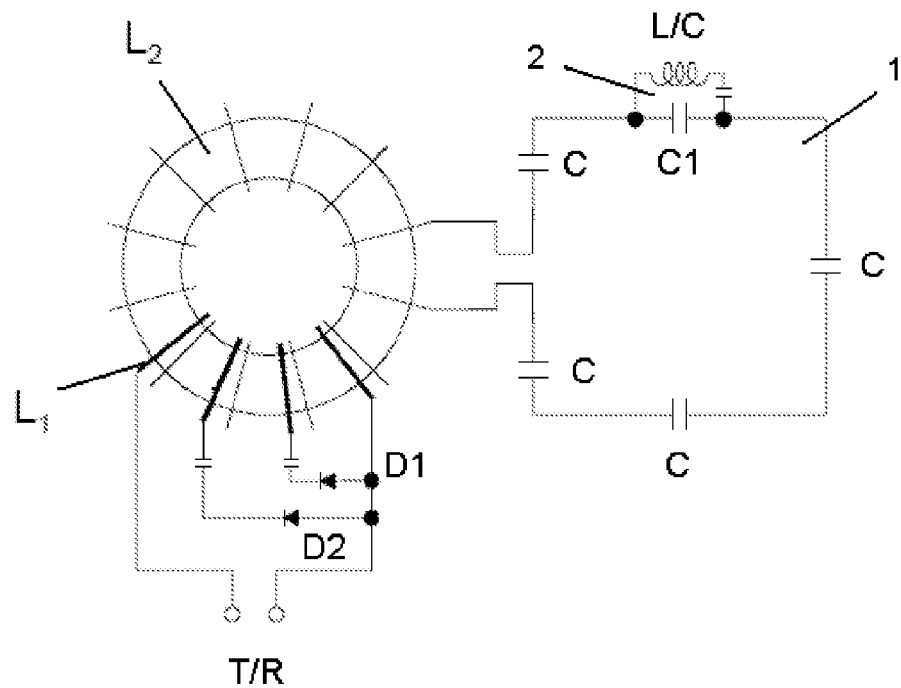
FIG. 5 shows a third embodiment of an inductive coupling device.

FIG. 5 shows a dual resonant antenna 1, 2, again according to the first embodiment which is inductively coupled by means of a third embodiment of an inductive coupling device L1, L2 with terminals T/R for connecting a transmit and/or receive channel as mentioned above.

The third embodiment of the inductive coupling device largely corresponds with the second embodiment of the inductive coupling device as explained above and indicated in FIG. 4, with the exception, that the first coil L1 which is wound around a section of the toroid of the second coil L2 is a tapped coil which is switchable with respect to the number of windings which are effectively connected with the terminals T/R. In order to realize this, one or a plurality of taps are provided along the first coil L1 which are each connected by means of each a PIN diode D1, D2 with one of the terminals T/R. A desired number of effective windings of the first coil L1 is selected by selecting and biasing conductive the one of the PIN diodes D1, D2 which is connected with the related tap of the first coil L1. By this, the magnetic flux and consequently the inductive coupling between both coils L1, L2 and by this the tuning and matching of the antenna 1, 2 can be adjusted as explained above.

Figure 6:
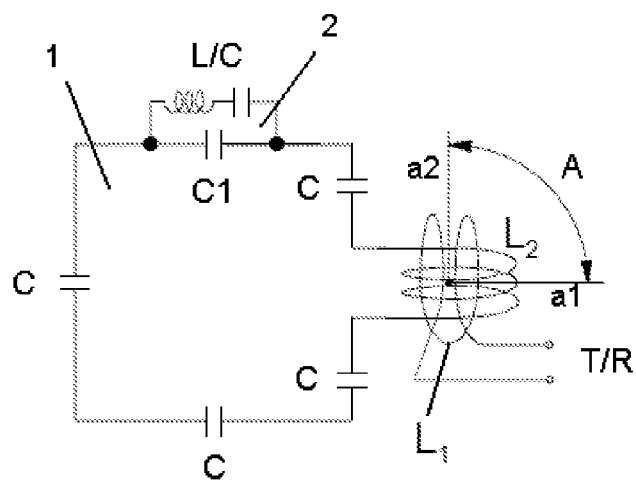
FIG. 6 shows a fourth embodiment of an inductive coupling device.

FIG. 6 shows a dual resonant antenna 1, 2, again according to the first embodiment which is inductively coupled by means of a fourth embodiment of an inductive coupling device L1, L2 with terminals T/R for connecting a transmit and/or receive channel as mentioned above.

The fourth embodiment of the inductive coupling device is realized in the form of a first coil L1 having a first number of windings which are wound around a longitudinal axis a1 of the first coil L1, and a second coil L2 having a second number of windings which are wound around a longitudinal axis a2 of the second coil L2. Again, the first coil L1 is connected with terminals T/R and the second coil L2 is connected with the antenna 1, 2. Both coils L1, L2 can be rotated in relation to each other such that the angle between their longitudinal axis a1, a2 as indicated by the arrow A can be adjusted between about 0 and about 180° or between about 0° and about 90°. By this, again the magnetic flux and consequently the inductive coupling between both coils L1, L2 and by this the tuning and matching of the antenna 1, 2 can be adjusted as explained above.

Figure 7:
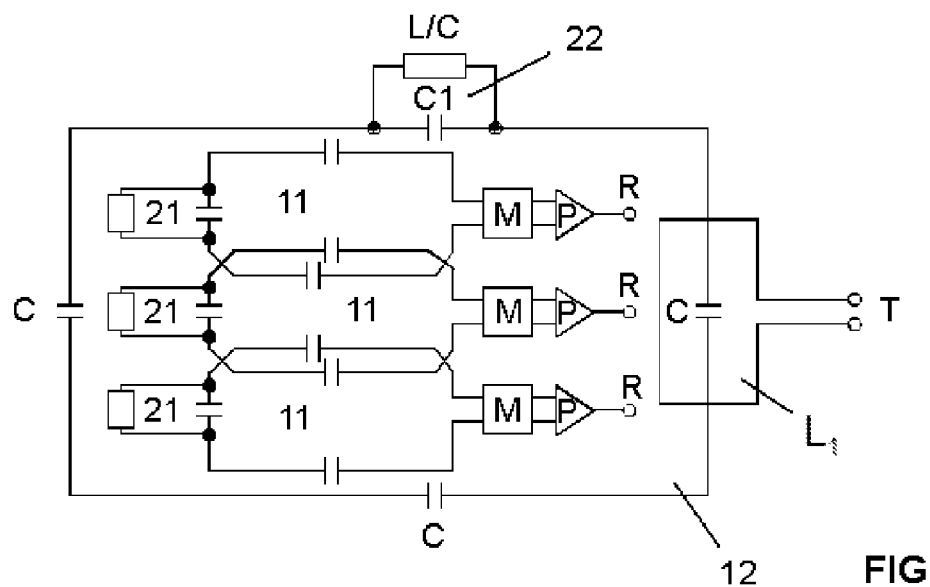
FIG. 7 shows a second embodiment of an antenna together with an inductive coupling device.

FIG. 7 shows a dual resonant antenna according to a second embodiment. It comprises a dual resonant transmit antenna 12 which is inductively coupled by means of one of the embodiments of the inductive coupling devices L1, L2 as disclosed above and in the following with terminals T for connecting a transmit channel for feeding the transmit antenna 12 with RF excitation signals to be transmitted. Further, the second embodiment of the antenna comprises three dual resonant receive antennas 11 in the form of an antenna array, which are arranged side by side, preferably with an overlapping as indicated in FIG. 7 and in parallel planes above each other, or without an overlapping of one another (and preferably in a common plane). Again, the receive antennas 11 are each inductively coupled by means of one of the embodiments of the inductive coupling devices L1, L2 as disclosed above and in the following with terminals R for connecting each a receive channel for processing RF excitation signals which are received by the receive antennas 11. Exemplarily, FIG. 7 shows that the receive antennas 11 are each connected by means of an impedance matching network M and a preamplifier P with the related terminal R. Finally, the three receive antennas 11 are preferably enclosed by the transmit antenna 12 as indicated in FIG. 7. Both the transmit and receiver antennas 12, 11 are dimensioned as such as explained above with respect to FIGS. 1 and 2.

Figure 8:
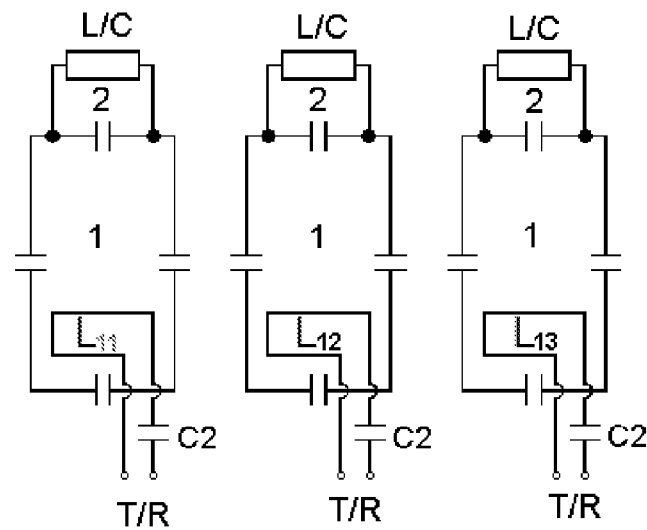
FIG. 8 shows a third embodiment of an antenna together with an inductive coupling device.

FIG. 8 shows a third embodiment of a dual resonant antenna in the form of an antenna array. It comprises three dual resonant transmit and/or receive antennas 1, 2 which are arranged side by side preferably in a common plane and which are each inductively coupled by means of one of the embodiments of the inductive coupling devices as disclosed above and in the following each with terminals T/R for connecting each a transmit and/or receive channel as explained above. According to FIG. 8, the inductive coupling device is realized for each of the three antennas 1, 2 each in the form of an inductive coupling loop L11, L12, L13 as explained above with respect to FIGS. 1 and 2.

Figure 9:
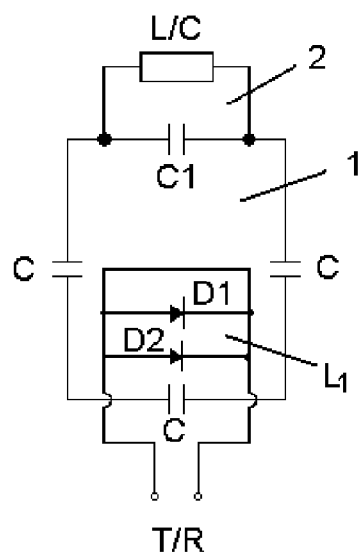
FIG. 9 shows a fifth embodiment of an inductive coupling device.

FIG. 9 shows a dual resonant antenna 1, 2, again according to the first embodiment shown in FIGS. 1 and 2, which is inductively coupled by means of a fifth embodiment of an inductive coupling device L1 with terminals T/R for connecting a transmit and/or receive channel as mentioned above.

The fifth embodiment of the inductive coupling device is realized in the form of a coupling loop L1 which has an effective coupling area which by switching can be enlarged or reduced, so that accordingly the magnetic flux and consequently the inductive coupling between the loop L1 and the antenna 1, 2 can be adjusted for tuning and matching of the antenna as explained above. This is a obtained by dividing the area which is enclosed by the loop L1 into a number of smaller areas by means of one or a plurality of electrical conductors into which each a PIN diode D1, D2 is serially connected, so that by switching one or more of the PIN diodes D1, D2 conductive or non conductive, the effective area of the loop L1 can be selected with respect to its extension and also with respect to its position within the loop L1.

Figure 10:
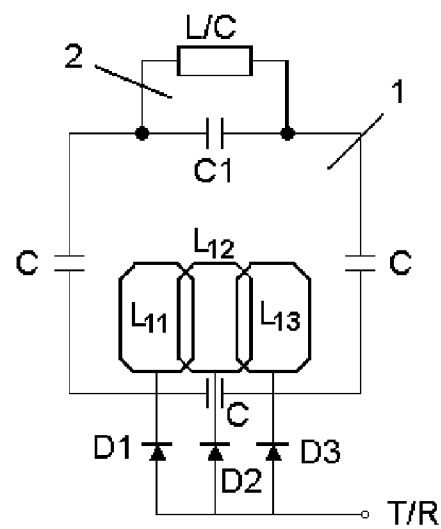
FIG. 10 shows a sixth embodiment of an inductive coupling device.

FIG. 10 shows a dual resonant antenna 1, 2, again according to the first embodiment shown in FIGS. 1 and 2, which is inductively coupled by means of a sixth embodiment of an inductive coupling device L11, L12, L13 with terminals T/R for connecting a transmit and/or receive channel as mentioned above.

The sixth embodiment of the inductive coupling device is realized in the form of e.g. three loops L11, L12, L13 which are positioned side by side preferably with a small overlapping of each other and in parallel planes above each other, wherein into the connection between each loop and the terminals T/R each a diode D1, D2, D3 is serially connected. The diodes can be switched independently from each other by accordingly voltage biasing conductive or non conductive. By this, in a similar manner as in the fifth embodiment according to FIG. 9, the effective coupling area can be enlarged or reduced, so that accordingly the magnetic flux and consequently the inductive coupling of the antenna 1, 2 with the terminals T/R can be adjusted for tuning and matching as explained above.

Figure 11:
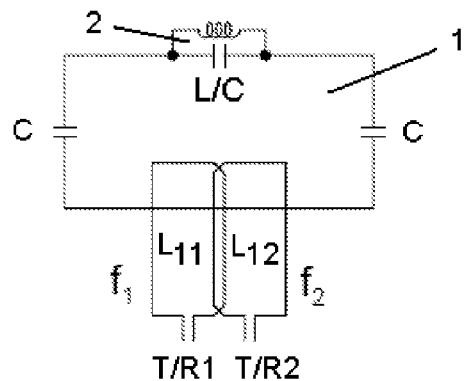
FIG. 11 shows a seventh embodiment of an inductive coupling device.

FIG. 11 shows a dual resonant antenna 1, 2, again according to the first embodiment shown in FIGS. 1 and 2, which is inductively coupled by means of a seventh embodiment of an inductive coupling device L11, L12 with first and second terminals T/R1, T/R2 for connecting each a transmit and/or receive channel as mentioned above.

In contrast to the above embodiments, this seventh embodiment comprises a first coupling loop L11 and a second coupling loop L12 which are provided for coupling with the dual resonant antenna 1, 2 separately at its first and second resonant frequency f1, f2, respectively. Accordingly, the first and second terminals T/R1, T/R2 are provided for coupling transmit and/or receive signals at the first and the second frequency, respectively. Again, the coupling loops L11, L12 are preferably positioned side by side with a small overlap of each other and in parallel planes above each other in order to at least partly compensate mutual couplings of the coupling loops L11, L12 as in the sixth embodiment shown in FIG. 10.

Regarding the number of windings, the extensions, positioning and the effective areas of the loops L11, L12, reference is made to the related explanations above.

Figure 12:
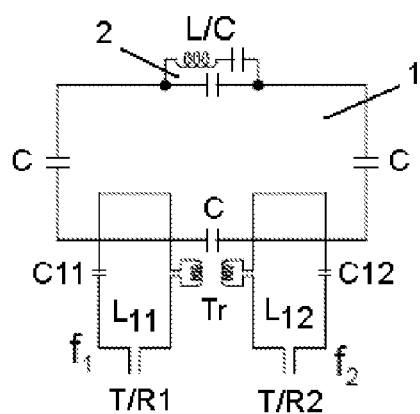
FIG. 12 shows an eighth embodiment of an inductive coupling device.

FIG. 12 shows a dual resonant antenna 1, 2, again according to the first embodiment shown in FIGS. 1 and 2, which is inductively coupled by means of an eighth embodiment of an inductive coupling device L11, L12 with a first and a second terminal T/R1, T/R2 for connecting each a transmit and/or receive channel as mentioned above.

Again, the inductive coupling device comprises a first coupling loop L11 and a second coupling loop L12 for coupling with the dual resonant antenna separately at its first and second resonant frequency f1, f2, respectively. In contrast to the above seventh embodiment, mutual couplings of the coupling loops are avoided or at least reduced by means of a transformer Tr having a first winding which is connected in series into the first coupling loop L11 and a second winding which is connected in series into the second coupling loop L12. By this, an inductive decoupling can be obtained between both coupling loops. The capacitors C11, C12 which are serially connected into the coupling loops L11, L12 are provided for controlling the current in the coupling loop as explained above with reference to FIGS. 1 and 2.

Figure 13:
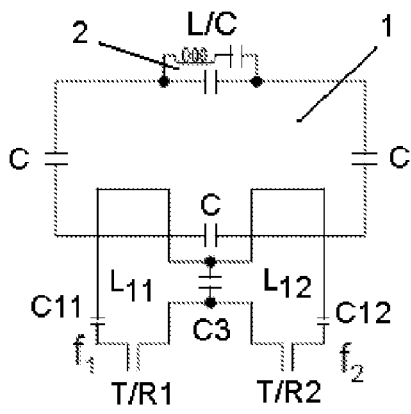
FIG. 13 shows a ninth embodiment of an inductive coupling device.

As an alternative to the eighth embodiment shown in FIG. 12, FIG. 13 shows a ninth embodiment of an inductive coupling device in which the first and the second coupling loops L11, L12 which are again provided for coupling with the antenna at the first and the second resonant frequency, respectively, are capacitively decoupled from each other by means of a capacitor C3 which is serially connected into both coupling loops L11, L12. Apart from this, reference is made to the above embodiments explained in connection with FIGS. 11 and 12.

Figure 14:
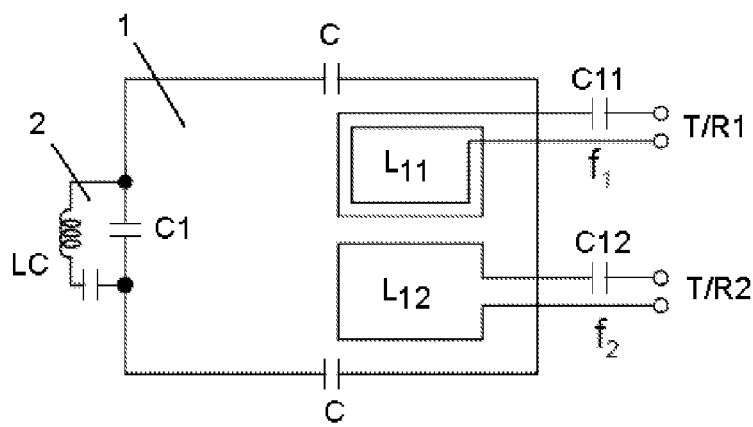
FIG. 14 shows a tenth embodiment of an inductive coupling device.

FIG. 14 shows a dual resonant antenna 1, 2, again according to the first embodiment shown in FIGS. 1 and 2, which is inductively coupled by means of an tenth embodiment of an inductive coupling device L11, L12 with first and second terminals T/R1, T/R2 for connecting each a transmit and/or receive channel for the first and the second resonant frequency, respectively, of the antenna as explained above.

The inductive coupling device comprises a first coupling loop L11 and a second coupling loop L12 for coupling with the dual resonant antenna 1, 2 separately at its first and second resonant frequency, respectively. The coupling loops are arranged adjacent to each other without an overlapping of one another. According to this embodiment, the first coupling loop L11 is provided for the lower of the two resonant frequencies and has more windings than the second coupling loop L12 which is provided for the higher of the two resonant frequency is. By this, the inductive coupling of the first coupling loop is increased.

Figure 15:
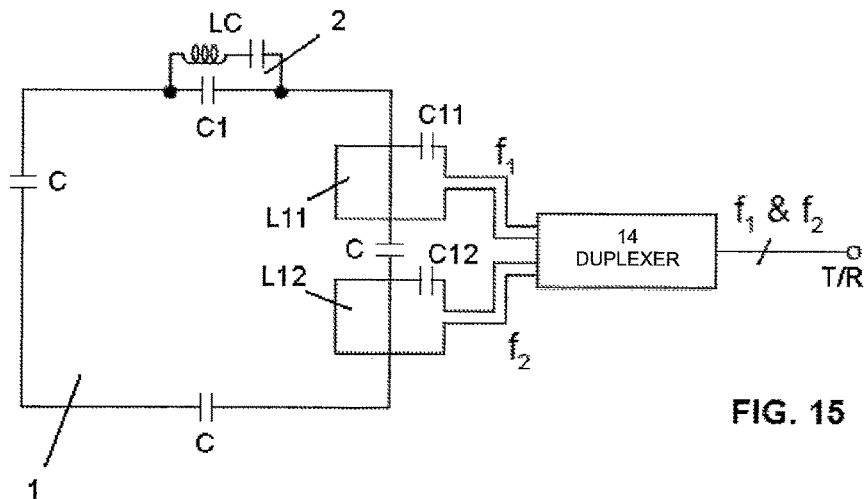
FIG. 15 shows an eleventh embodiment of an inductive coupling device.

Instead of providing first and second terminals T/R1, T/R2 for the first and the second resonant frequency, according to an eleventh embodiment of the inductive coupling device as indicated in FIG. 15, both coupling loops L11, L12 can also be connected via a duplexer 14 with only one cable connection which is commonly used for both resonant frequencies and for connecting both transmit and/or receive channels at a remote MR system. Apart from this, reference is made to the above embodiments as explained in connection with FIGS. 11 to 14.

Figure 16:
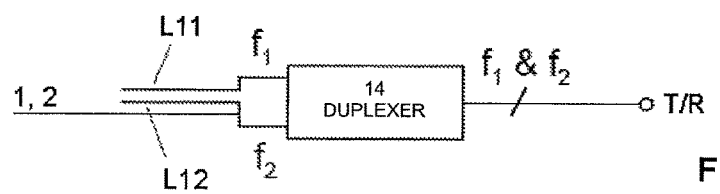
FIG. 16 shows a schematic side view of a twelfth embodiment of an inductive coupling device.

FIG. 16 schematically shows a side view of a twelfth embodiment of an inductive coupling device, according to which in contrast to the embodiments shown in FIGS. 12 to 15, the first and the second coupling loops L11, L12 are not arranged in a common plane but above each other in parallel planes (i.e. displaced in a direction of their perpendicular projections) above the plane of the antenna 1, 2. In such a case, the coupling loops L11, L12 can be arranged side by side or partly or totally overlapping each other when viewed in a direction perpendicular onto the planes. Further, FIG. 16 again shows the optional duplexer 14 as explained above.

Figure 17:
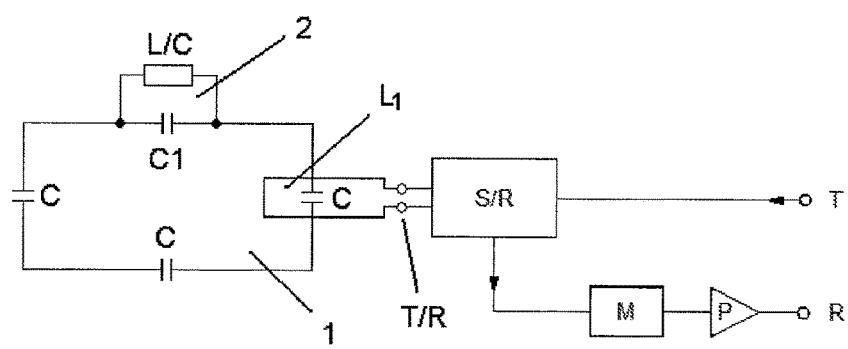
FIG. 17 shows a schematic block diagram of a dual resonant antenna, an inductive coupling device and a transmit and receive channel according to the invention.

FIG. 17 shows a schematic block diagram of a dual resonant antenna 1, 2, an inductive coupling device L1 and a transmit and receive channel. The antenna 1, 2 and the inductive coupling device L1 can be provided as explained above with reference to the various embodiments.

According to this block diagram, the transmit and receive channel which is connected with the terminals T/R of the coupling loop L1 is divided by means of a known transmit/receive switch SR into a transmit path T and a receive path R. The receive path R comprises an impedance matching network M, via which the received signals are applied to an input of a high impedance preamplifier P. By such an impedance matching network M, an optimal signal to noise ratio can be obtained for both resonant frequencies so that no extra tuning and matching is to be made in the receive path. The transmit path T has a fixed tuning and matching.

Figure 18:
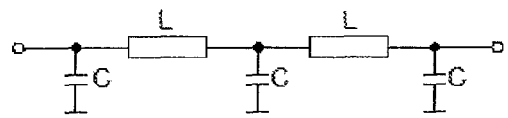
FIG. 18 shows matching components of FIG. 17 in more details.
Figure 19:
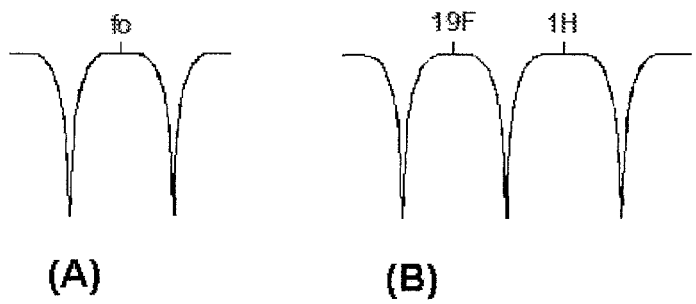
FIG. 19 shows transfer functions for different frequency matching.

FIG. 18 shows an exemplary embodiment of such an impedance matching network M. It comprises a number of parallel capacitors C which are connected by serial inductances L. The capacitors C and inductances L are dimensioned such that an optimal impedance matching for both resonant frequencies at the input of the preamplifier P is obtained. FIG. 19(A) schematically shows the transfer function S21 of a matching network for a conventional single frequency matching in comparison to FIG. 19(B) which shows the transfer function S21 for the dual resonant frequency matching exemplarily for $19^F$ and $1^H$ nuclei.

Figure 20:
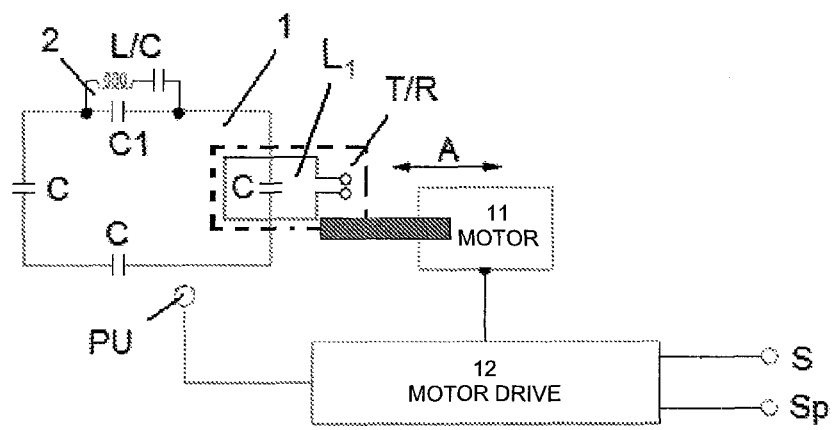
FIG. 20 shows a schematic block diagram of a first embodiment of an automatic tuning and matching device according to the invention.

FIG. 20 shows a schematic block diagram of a first embodiment of an automatic tuning and matching device according to the invention together with a dual resonant antenna 1, 2 and an inductive coupling device L1. The antenna 1, 2 and the inductive coupling device L1 can be provided as explained above with reference to the various embodiments.

The automatic tuning and matching device comprises a drive motor 11, especially in the form of a piezo drive motor, a drive circuit 12 for driving the drive motor 11, and a pick up coil or loop PU which is loaded by the antenna 1, 2 and which is connected with the drive circuit 12. The drive motor 11 is mechanically connected with the inductive coupling device (which is indicated in this Figure in the form of an inductive coupling loop L1) for displacing the coupling loop L1 along a translational motion path as indicated by the arrow A, namely either in a direction towards the antenna 1, 2 or away from the antenna 1, 2, and by this for increasing or decreasing the magnetic flux between the antenna 1, 2 and the inductive coupling loop L1.

Alternatively, the motor 11 can also be provided for turning the first coil L1 as shown in and explained with reference to FIG. 4 or FIG. 6.

Further, the drive circuit 12 is connected with an MR spectrometer Sp. Preferably, a connection S to an external power supply is provided for supplying the motor 11 and the drive circuit 12 with electric power.

The drive circuit 12 drives the drive motor 11 in dependence on the signals received by the pick up coil PU from the antenna 1, 2, so that a desired tuning and matching at the related resonant frequencies as explained above with reference to FIG. 3 is obtained automatically.

Figure 21:
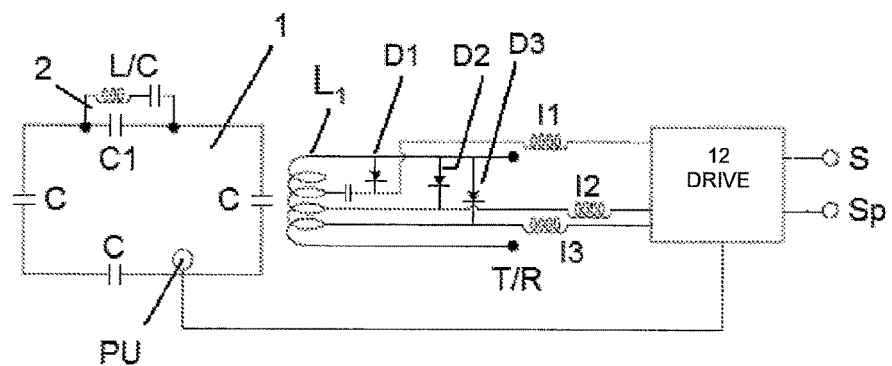
FIG. 21 shows a schematic block diagram of a second embodiment of an automatic tuning and matching device according to the invention.

FIG. 21 shows a schematic block diagram of a second embodiment of an automatic tuning and matching device according to the invention together with a dual resonant antenna 1, 2 and an inductive coupling device L1. The antenna 1, 2 and the inductive coupling device L1 can be provided as explained above with reference to the various embodiments.

This automatic tuning and matching device comprises a drive circuit 12 and a pick up coil or directional coupler PU which is loaded by the antenna 1, 2 and which is connected with the drive circuit 12. Instead of mechanically displacing the inductive coupling loop according to the first embodiment shown in FIG. 20, the magnetic flux between the antenna 1, 2 and the inductive coupling loop L1 is varied according to the second embodiment by selecting the effective number of windings of the inductive coupling loop L1 by accordingly short circuiting one or more of these windings by means of the drive circuit 11.

In order to obtain this, the drive circuit 12 has at least one but preferably a plurality of outputs which are each connected via an inductance I1, I2, . . . with one of a plurality of PIN diodes D1, D2, . . . which each connect one of a number of taps of the inductive coupling loop L1 with one of its terminals as explained above with reference to FIG. 5.

By voltage biasing at least one of the diodes D1, D2, . . . conductive, an according number of windings of the inductive coupling loop L1 is short circuited, so that the number of effective windings and by this the magnetic flux between the antenna 1, 2 and the inductive coupling loop L1 is accordingly decreased.

Alternatively, instead of the coupling loop L1 shown in FIG. 21, also the first coil L1 according to FIG. 5 can be switched by means of the drive circuit 12.

The number of diodes D1, D2, . . . which are voltage biased conductive and non conductive is selected by the drive circuit 12 in dependence on the output signals of the pick up coil or directional coupler PU automatically such that a desired tuning and matching at the related resonant frequencies is obtained as explained above.

Figure 22:
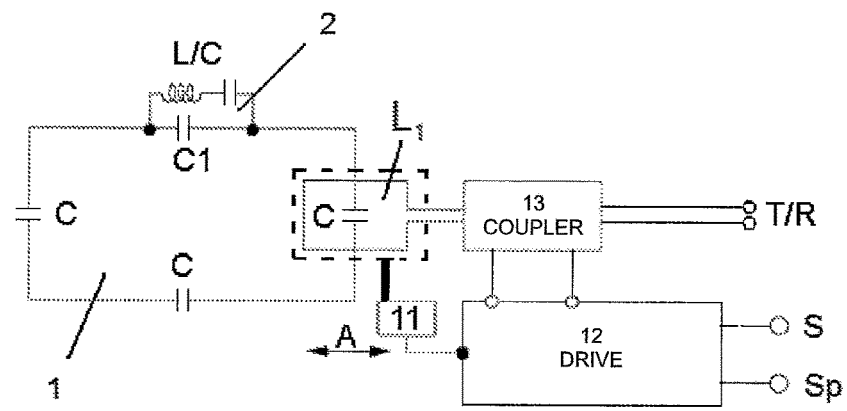
FIG. 22 shows a schematic block diagram of a third embodiment of an automatic tuning and matching device according to the invention.

FIG. 22 shows a schematic block diagram of a third embodiment of an automatic tuning and matching device according to the invention together with a dual resonant antenna 1, 2 and an inductive coupling device L1. The antenna 1, 2 and the inductive coupling device L1 can be provided as explained above with reference to the various embodiments.

This automatic tuning and matching device comprises a drive motor 11, especially in the form of a piezo drive motor, a drive circuit 12 for driving the drive motor 11, and a directional coupler 13 which is connected with the drive circuit 12. Instead of a pick up coil PU which is provided according to the first and the second embodiment as shown in FIGS. 20 and 21 for being loaded by the antenna 1, 2, the directional coupler 13 is provided for coupling out a fraction of the signal which is induced in the inductive coupling device L1 by the antenna 1, 2. In dependence on this signal, the drive circuit 12 again operates the drive motor 11 for displacing the inductive coupling device L1 in relation to the antenna 1, 2 and by this to increase or decrease the magnetic flux between the antenna 1, 2 and the inductive coupling device L1 in order to obtain a desired tuning and matching at the related resonant frequencies automatically as explained above with reference to FIG. 20.

Alternatively, the drive circuit 12 (and the inductive coupling device L1) could also be provided according to the second embodiment as shown in FIG. 21 for generating a bias voltage for PIN diodes in order to a select an appropriate number of effective windings of the inductive coupling loop for obtaining a desired tuning and matching at the related resonant frequencies automatically as explained above.

Figure 23:
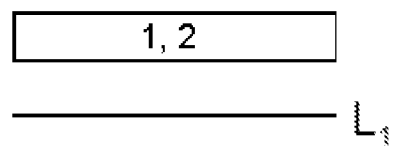
FIG. 23 shows a first arrangement of an antenna and an inductive coupling device.

FIG. 23 shows a first general arrangement of a dual or multi-resonant antenna 1, 2 and an inductive coupling device L1. The antenna 1, 2 is for example fully capsulated and waterproof. The comparatively flat inductive coupling device L1 can for example be hidden together with a related RF connection cable in the bed of a patient or a separate holder and is positioned substantially parallel to the antenna.

Figure 24:
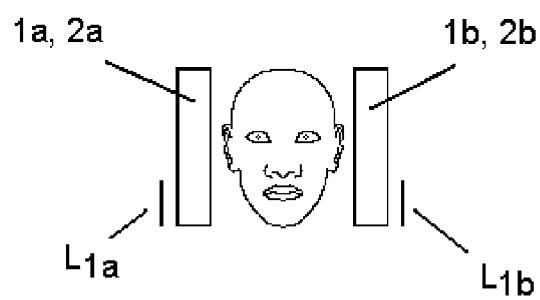
FIG. 24 shows a second arrangement of an antenna and an inductive coupling device.

FIG. 24 shows a second general arrangement of a first and a second dual or multi-resonant antenna 1a, 2a; 1b, 2b, together with each one inductive coupling device L1a, L1b on opposite sides of a head of a patient. According to this arrangement, the inductive coupling devices L1a, L1b each extend substantially in parallel to but only along a small part of the length of the first and the second antenna, respectively.

Figure 25:
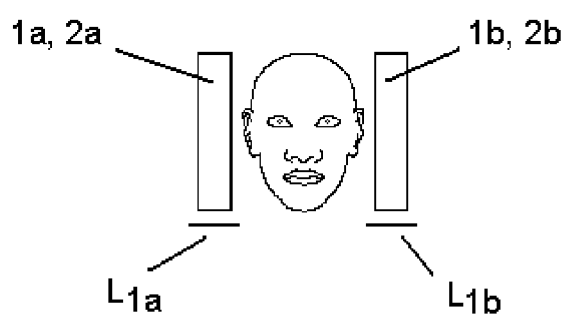
FIG. 25 shows a third arrangement of an antenna and an inductive coupling device.

FIG. 25 shows a third general arrangement again of a first and a second dual or multi-resonant antenna 1a, 2a; 1b, 2b, together with each one inductive coupling device L1a, L1b on opposite sides of a head of a patient. According to this arrangement, the inductive coupling devices L1a, L1b are each positioned at one of the ends of the antennas.

It shall be mentioned that generally any of the above and other embodiments of the dual resonant RF/MR transmit and/or receive antennas can be combined with any of the above and other embodiments of the inductive coupling devices. The selection and combination is determined substantially by the proposed application and environmental conditions of the related antenna.

Further, the term "loop" or "coupling loop" which is used above in connection with the inductive coupling device is not limited to a loop having only one winding. A loop in the above sense can also have more than one winding as indicated for example in FIG. 14. Finally, the terms "loop" and "coil" which are used above in connection with the inductive coupling device are interchangeable with each other.

Figure 26:
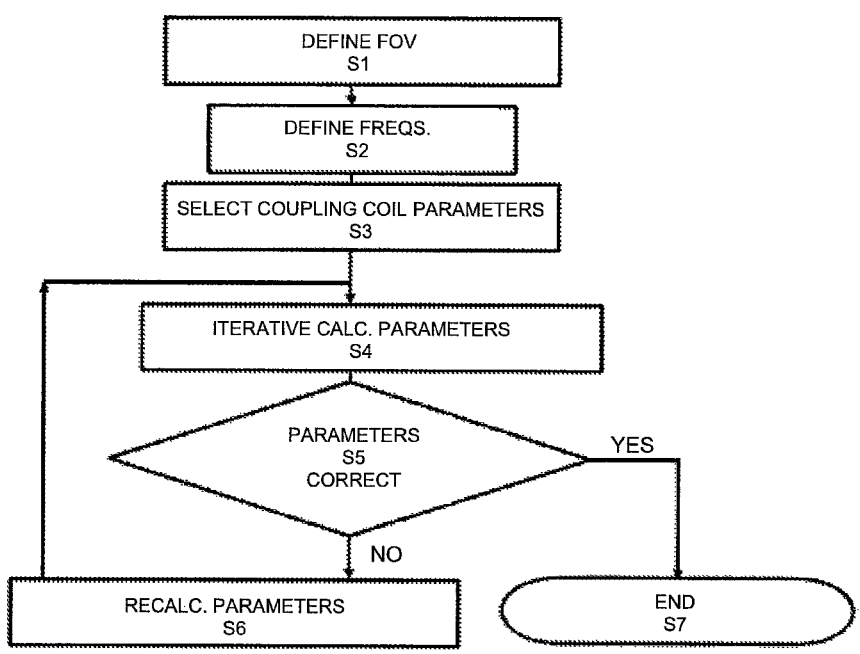
FIG. 26 shows a principal flow chart for calculating the geometries of the inductive coupling devices according to the invention.

FIG. 26 shows a principal flow chart of the calculation process for the geometries of the above inductive coupling devices for impedance matching of the above and other dual resonant RF/MR transmit and/or receive antennas. This calculation process is preferably conducted by means of a computer program.

In a first step S1, the desired geometry and the desired field of view of the related dual resonant antenna is defined. In a second step S2, the desired resonant frequencies of the antenna are defined. In a third step S3, the inductive coupling device is parameterized especially with respect to the length, widths, number of windings, width of conductors, and other of the related inductive coupling loop or coil.

With a fourth step S4, an iterative calculation of the S11 parameters of the inductive coupling device is started for the defined dual resonant antenna both in a loaded and an unloaded condition.

In a fifth step S5, it is interrogated if the calculated S11 parameters of the inductive coupling device obtain the desired values for the loaded and unloaded dual resonant antenna at both resonant frequencies.

If this is not true, the geometry like especially the size, the number of windings and the values of capacitors of the inductive coupling device are changed in a sixth step S6, and the process is repeated beginning with the fourth step S4.

If the S11 parameters of the inductive coupling device obtain the desired values for the loaded and unloaded dual resonant antenna at both resonant frequencies, the process is ended with a seventh step S7, so that the impedance matching is obtained at the desired frequencies and load conditions with the calculated S11 parameters.

The iterative program for the parameterization uses known electromagnetic simulation programs and algorithms like MoM, REM and FDTD.

While the invention has been illustrated and described in detail in the drawings and foregoing description, such illustration and description are to be considered illustrative or exemplary and not restrictive, and the invention is not limited to the disclosed embodiments. Variations to embodiments of the invention described in the foregoing are possible without departing from the scope of the invention as defined by the accompanying claims.

Variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A dual- or multi-resonant RF/MR transmit and/or receive antenna system, comprising:
    an antenna (1, 2) comprising an antenna coil (1) and at least one resonant circuit (2), the at least one resonant circuit (2) being serially connected into the antenna coil (1) in order to tune the antenna (1, 2) concurrently to at least two resonant frequencies corresponding to Larmor frequencies of two or more nuclei of interest;
    an inductive coupling device including at least one coupling loop (L1, or L2) dimensioned and/or positioned in relation to the antenna (1, 2) such that the at least one coupling loop and the antenna (1, 2)
    a) are inductively coupled by a resulting magnetic flux occurring between the at least one coupling loop (L1, or L2) and the antenna (1, 2) at each of the concurrent resonant frequencies of the antenna (1, 2) and
    b) are impedance-matched to each of the RF/MR transmit and/or receive channels,
    wherein the at least one coupling loop (L1, or L2) is movably mounted to be mechanically displaced a physical distance (A) in relation to the antenna (1, 2) when adjusting the magnetic flux between the antenna (1, 2) and the inductive coupling device, with the inductive coupling being broadband such that concurrent tuning and matching is applied to all resonant frequencies permitting simultaneous MR imaging to be performed at each of the at least two resonant frequencies.

2. The dual- or multi-resonant RF/MR transmit and/or receive antenna system according to claim 1, wherein the inductive coupling device includes:
    a first loop (LI) which is connected with the RF/MR transmit/receive channel and a second loop (L2) which is connected with the antenna coil (1), the first and second loop (L1, or L2) being disposed in order to inductively couple with each other.

3. The dual- or multi-resonant RF/MR transmit and/or receive antenna system according to claim 2, wherein the first loop (LI) is disposed in a displaceable physical distance (A) relation to the second loop (L2) when adjusting the magnetic flux therebetween.

4. The dual- or multi-resonant RF/MR transmit and/or receive antenna system according to claim 1, wherein the antenna (1, 2) and the inductive coupling device (L1, or L2) are only inductively coupled to one another.

5. An MR imaging apparatus or system comprising the dual- or multi-resonant RF/MR transmit and/or receive antenna system according to claim 1.

6. The dual- or multi-resonant RF/MR transmit and/or receive antenna system according to claim 1, wherein the inductive coupling device includes:
    a first coupling coil (L11) configured to inductively couple with the antenna (1, 2) at a first resonant frequency (f1) and a second coupling coil (L12) configured to inductively couple with the antenna (1, 2) at a second resonant frequency (f2) concurrent.

7. The dual- or multi-resonant RF/MR transmit and/or receive antenna system according to claim 6, wherein the first coupling coil (L11) and the second coupling coil (L12) are at least partly overlapping with one another in order to at least partly compensate for mutual inductive coupling.

8. The dual- or multi-resonant RF/MR transmit and/or receive antenna system according to claim 6, further including:
    a capacitor (C3) serially connected between the first coupling coil (L11) and the second coupling coil (L12) in order to at least partially compensate for a mutual inductive coupling between the first coupling coil (L11) and the second coupling coil (L12).

9. The dual- or multi-resonant RF/MR transmit and/or receive antenna system according to claim 6, further including:
    a transformer (Tr) having a first winding which is serially connected into the first coupling coil (L11) and a second winding which is serially connected into the second coupling coil (L12) in order to at least partially compensate a mutual inductive coupling between the first and the second coupling coils (L11, and L12).

10. The dual- or multi-resonant RF/MR transmit and/or receive antenna system according to claim 6, wherein the RF/MR transmit and/or receive channels are carried on a common RF transmission line and further including:

a duplexer (14) connecting the first coupling coil (L11) and the second coupling coil (L12) with the common RF transmission line.

11. The dual- or multi-resonant RF/MR transmit and/or receive antenna system according to claim 1, further including:
    a drive motor (11) configured to move the at least one coupling loop (L1, or L2) said physical distance relative to the antenna (1, 2), and
    a drive circuit (12) configured to drive the drive motor (11) based on an output signal of a pickup coil (PU) or a directional coupler (13) which is independently coupled by the antenna (1, 2).

12. The dual- or multi-resonant RF/MR transmit and/or receive antenna system according to claim 1, further including:
    a motor (11) configured to move the at least one coupling loop (L1 or L2) or the antenna (1) a physical distance relative to the antenna coil (1, 2) in order to adjust the magnetic flux between the antenna (1, 2) and the inductive coupling device (L1 or L2).

13. The dual- or multi-resonant RF/MR transmit and/or receive antenna system according to claim 1, wherein the antenna (1, 2) is a planar antenna.

14. The dual- or multi-resonant RF/MR transmit and/or receive antenna system according to claim 13, wherein the at least one coupling loop (L1 or L2) is configured to move said physical distance (A) in a plane of the planar antenna.

15. An RF/MR transmit and/or receive antenna system comprising:
    an RF antenna concurrently and simultaneously tuned to magnetic resonance Larmor frequencies of first and second nuclei, the RF antenna including an antenna coil connected in series with a resonant circuit;
    an inductive coupling device configured to inductively couple the RF antenna with an RF/MR transmit and/or receive antenna system channel, the inductive coupling device being broadband and permitting a concurrent and simultaneous tuning and matching with the magnetic resonance Larmor frequencies of the first and second nuclei including:
    a coupling coil having a plurality of windings, the plurality of windings being disposed adjacent the antenna coil in order to inductively couple at least one winding of the plurality of windings to the antenna coil, and
    one or more diodes connected with the plurality of windings, the windings being configured to be biased between conductive and nonconductive states by applying a related bias voltage onto the one or more diodes in order to change a magnetic flux between the plurality of windings and the antenna coil in order to adjust the inductive coupling.

16. The RF/MR transmit and/or receive antenna system according to claim 15, further including:
    a drive circuit (12) that is configured to select and switch the diodes (D1, D2 . . .) between conductive and non-conductive states, depending on an output signal of a pickup coil (PU), or a directional coupler (13) which is independently coupled by the antenna (1, 2).

17. A magnetic resonance antenna system configured for transmitting and/or receiving magnetic resonance signals concurrently at first and second magnetic resonance Larmor frequencies corresponding to first and second nuclei, the magnetic resonance antenna system comprising:
    an MR antenna configured to be concurrently resonant simultaneously at each of the first and second magnetic resonance Larmor frequencies;
    at least one resonant circuit serially connected to the MR antenna concurrently tuned to both the first and second magnetic resonance Larmor frequencies;
    a broadband coupling coil disposed adjacent the MR antenna such that the broadband coupling coil inductively couples to the MR antenna, at least at each of the first and second resonance frequencies, the broadband coupling coil also being directly coupled with a transmit and/or receive channel of the MR antenna system; and
    a motor configured to move the broadband coupling coil relative to the MR antenna a physical distance when adjustment of the inductive coupling between the MR antenna and the broadband coupling coil is required.

* * * * *